United States Patent
Jeong et al.

(10) Patent No.: US 12,259,662 B2
(45) Date of Patent: Mar. 25, 2025

(54) METHODS FOR MANUFACTURING SEMICONDUCTOR DEVICES USING MOIRÉ PATTERNS

(71) Applicant: Samsung Electronics Co., Ltd., Suwon-si (KR)

(72) Inventors: Woohyeok Jeong, Hwaseong-si (KR); Donghwan Kim, Pyeongtak-si (KR); Inchul Shin, Suwon-si (KR); Wonhyeok Jo, Daejeon (KR); Hyein Cho, Seoul (KR); Seulgi Han, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 218 days.

(21) Appl. No.: 17/982,761

(22) Filed: Nov. 8, 2022

(65) Prior Publication Data
US 2023/0152715 A1  May 18, 2023

(30) Foreign Application Priority Data
Nov. 12, 2021  (KR) .......................... 10-2021-0155673

(51) Int. Cl.
*G03F 7/00* (2006.01)
*G01N 21/95* (2006.01)
*H01L 23/544* (2006.01)
*G02B 27/60* (2006.01)

(52) U.S. Cl.
CPC ..... *G03F 7/70633* (2013.01); *G01N 21/9501* (2013.01); *G03F 7/70216* (2013.01); *G03F 7/70683* (2013.01); *H01L 23/544* (2013.01); *G02B 27/60* (2013.01)

(58) Field of Classification Search
CPC ............ G03F 7/70616; G03F 7/70625; G03F 7/70633
See application file for complete search history.

(56) References Cited

U.S. PATENT DOCUMENTS

| 8,148,682 B2 | 4/2012 | Hotta et al. |
| 9,347,879 B2 | 5/2016 | Adel et al. |
| 9,934,939 B2 | 4/2018 | Kim et al. |

(Continued)

FOREIGN PATENT DOCUMENTS

| JP | 2017146202 A | 8/2017 |

*Primary Examiner* — Steven H Whitesell
(74) *Attorney, Agent, or Firm* — Myers Bigel, P.A.

(57) ABSTRACT

A method for manufacturing a semiconductor device may include: forming a first layer comprising a plurality of patterns, each pattern having a different respective pitch; performing exposure and development to form a second layer at a layer different from the first layer; determining whether a pitch shift of a part of exposure patterns formed is within a tolerance range, using a Moiré pattern; and performing etching for the second layer when the pitch shift of the part of exposure patterns is determined to be within the tolerance range. Performing the exposure and the development may include forming a first exposure pattern corresponding to a key pattern having a first pitch, forming a second exposure pattern corresponding to a cell pattern having a second pitch, and forming a third exposure pattern corresponding to a middle pitch pattern having a third pitch between the first pitch and the second pitch.

20 Claims, 11 Drawing Sheets

(56) References Cited

U.S. PATENT DOCUMENTS

| | | | |
|---|---|---|---|
| 10,473,460 B2 | 11/2019 | Gutman et al. | |
| 10,705,435 B2 | 7/2020 | Yang et al. | |
| 10,747,123 B2 | 8/2020 | Kim et al. | |
| 2007/0077503 A1* | 4/2007 | Yoo | G03F 7/70633 430/311 |
| 2017/0146810 A1* | 5/2017 | Levinski | G01B 11/02 |
| 2021/0200106 A1* | 7/2021 | Levinski | G02B 27/60 |

* cited by examiner

Moiré Effect

METHODS FOR MANUFACTURING SEMICONDUCTOR DEVICES USING MOIRÉ PATTERNS

CROSS-REFERENCE TO RELATED APPLICATION

This application claims the benefit of priority to Korean Patent Application No. 10-2021-0155673, filed on Nov. 12, 2021, in the Korean Intellectual Property Office, and the entire contents of the above-identified application are incorporated by reference herein.

TECHNICAL FIELD

The present disclosure relates to methods for manufacturing semiconductor devices using Moiré patterns. In particular, the present disclosure relates to methods for measuring pitch shifts (or pitches) of patterns using Moiré patterns.

BACKGROUND

Various methods may be used in order to align an interlayer overlay within a tolerance range. In particular, an optical method through application of diffractive imaging and a method using a scanning electron microscope may be used. However, overlay consistency may be degraded as the size of patterns to be formed on a substrate is excessively reduced.

In the above-mentioned methods, there can be a difficulty in process management and yield management because a measurement value at a particular layer may differ from a pattern shift on an actual cell. This may be because pitch shift on a pattern basis may be varied due to aberration of scanner equipment (for example, a scanning electron microscope) and various influences generated during execution of a process. Generally, in the case of an overlay key, such a phenomenon occurs because the overlay key has a greater pitch than a cell.

SUMMARY

The present disclosure provides methods for measuring a pitch shift of a cell pattern after exposure/development, but before etching, without using a scanning electron microscope, upon forming one layer in a photolithography process.

According to some exemplary embodiments, a method for manufacturing a semiconductor device may include: forming a first layer comprising a plurality of patterns, each of the plurality of patterns having a different respective pitch; performing exposure and development to form a second layer at a layer different from the first layer; determining whether or not a pitch shift of a part of exposure patterns formed by the performing the exposure and the development is within a tolerance range, using a Moiré pattern; and performing etching for the second layer when the pitch shift of the part of exposure patterns is measured to be within the tolerance range, wherein the performing the exposure and the development to form the second layer comprises forming a first exposure pattern corresponding to a key pattern having a first pitch, forming a second exposure pattern corresponding to a cell pattern having a second pitch, and forming a third exposure pattern corresponding to a middle pitch pattern having a third pitch between the first pitch and the second pitch.

According to some exemplary embodiments, a method for manufacturing a semiconductor device may include: forming a first layer comprising a first comparative pitch pattern and a second comparative pitch pattern respectively having different pitches; performing exposure and development to form a first exposure pattern having a first pitch, a second exposure pattern having a second pitch and a third exposure pattern having a third pitch between the first pitch and the second pitch at a second layer being a layer different from the first layer; determining whether or not the pitch shift of the second exposure pattern is within a predetermined range, based on arithmetically calculating a first difference between a pitch shift of the second exposure pattern and a pitch shift of a first region of the third exposure pattern, a second difference between the pitch shift of the first region of the third exposure pattern and a pitch shift of a second region of the third exposure pattern, a third difference between the pitch shift of the second region of the third exposure pattern and a pitch shift of the first exposure pattern, and a fourth difference between the pitch shift of the second exposure pattern and the pitch shift of the first exposure pattern; and performing etching for the second layer when the pitch shift of the second exposure pattern is within the predetermined range, such that a cell pattern having a pitch within a tolerance range is formed at the second layer.

According to some exemplary embodiments, a method for manufacturing a semiconductor device may include: forming a first layer comprising a plurality of patterns respectively having different pitches; performing exposure and development for a resist film to form a second layer at a layer different from the first layer; determining, using a Moiré pattern, whether or not a pitch shift of a part of exposure patterns formed at the resist film by the performing the exposure and the development is within a tolerance range; and performing etching for the second layer when the pitch shift of the part of exposure patterns is determined to be within the tolerance range, wherein the performing the exposure comprises forming a first exposure pattern having a first pitch, forming a second exposure pattern having a second pitch, and forming exposure patterns corresponding to a plurality of middle pitch patterns having a pitch between the first pitch and the second pitch, wherein the first layer is on a semiconductor substrate; wherein the second layer is on the first layer, wherein the exposure patterns corresponding to the plurality of middle pitch patterns are between the first exposure pattern and the second exposure pattern at the second layer.

DETAILED DESCRIPTION

Figure 1:
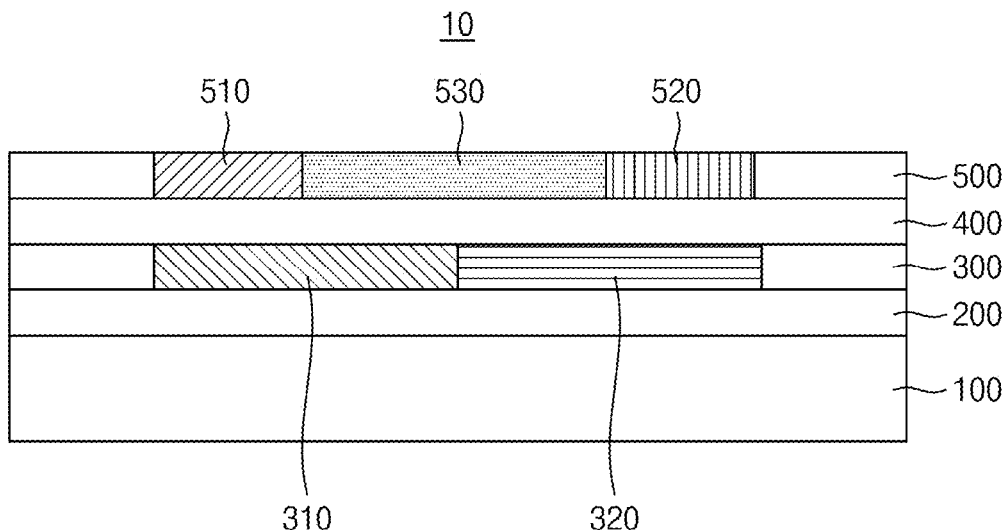
FIG. 1 is a schematic sectional view of a semiconductor device according to some exemplary embodiments of the disclosure.

FIG. 1 is a schematic sectional view of a semiconductor device according to some exemplary embodiments of the disclosure.

Referring to FIG. 1, in some embodiments, a semiconductor device 10 may include a semiconductor substrate 100, and a semiconductor device layer including a plurality of circuit patterns may be stacked on the semiconductor substrate 100.

For example, the semiconductor substrate 100 may include silicon (Si). In some embodiments, the semiconductor substrate 100 may be a wafer including silicon. Alternatively, the semiconductor substrate 100 may include a semiconductor element such as germanium (Ge) or a compound semiconductor such as silicon carbide (SiC), gallium arsenide (GaAs), indium arsenide (InAs), and indium phosphide (InP). Otherwise, the semiconductor substrate 100 may have a silicon-on-insulator (SOI) structure. For example, the semiconductor substrate 100 may include a buried oxide layer (BOX layer). The semiconductor substrate 100 may include a conductive region, such as a well doped with impurities, or a structure doped with impurities. In addition, the semiconductor substrate 100 may have various element isolation structures such as a shallow trench isolation (STI) structure.

The semiconductor device layer may include an integrated circuit in which a plurality of circuit patterns are stacked. In some embodiments, the semiconductor device layer may include a first insulating layer 200, a first layer 300, a second insulating layer 400, and a second layer 500. For example, the first insulating layer 200 may be on the semiconductor substrate 100, the first layer 300 may be on the first insulating layer 200, the second insulating layer 400 may be on the first layer 300, and the second layer 500 may be on the second insulating layer 400.

In some embodiments, at least one of the first insulating layer 200 and the second insulating layer 400 may be omitted from the semiconductor device 10. For example, the first layer 300 may be directly on the semiconductor substrate 100. For example, the second layer 500 may be directly on the first layer 300.

In some embodiments, in the semiconductor device 10, other layers may be included among the semiconductor substrate 100, the first insulating layer 200, the first layer 300, the second insulating layer 400 and the second layer 500. For example, at least one additional insulating layer, at least one wiring layer or at least one semiconductor layer may be between the first layer 300 and the second layer 500.

As an example, each of the first insulating layer 200 and the second insulating layer 400 may function as an interlayer insulating layer. Each of the first insulating layer 200 and the second insulating layer may include at least one of silicon oxide, silicon nitride, silicon oxynitride, and/or a low-k dielectric having a lower permittivity than the silicon oxide, without being limited thereto. The first insulating layer 200 and the second insulating layer 400 may include different materials, in some embodiments.

In some embodiments, the first insulating layer 200 and the second insulating layer 400 may each function as a buffer layer configured to reduce stress caused by a lattice constant difference between layers adjacent thereto (for example, the semiconductor substrate 100 and the first layer 300, or the first layer 300 and the second layer 500). In some embodiments, each of the first insulating layer 200 and the second insulating layer 400 may function as a barrier layer configured to prevent impurities such as hydrogen (H), etc. from being diffused from layers adjacent thereto into other layers, and to prevent current flowing in the adjacent layers from leaking to other layers.

In some embodiments, elements may be arranged within the first layer 300 and/or the second layer 300, and each element of the first layer 300 and the second layer 500 may be a pattern array structure having a fine pitch and a fine width. For example, each of the first layer 300 and the second layer 500 may be a layer formed with an element constituting a transistor or various wirings. For example, each of the first layer 300 and the second layer 500 may include a semiconductor material or a conductive material. In some embodiments, the first layer 300 may correspond to the above-described semiconductor substrate 100.

At least one of the first layer 300 and the second layer 500 may include a cell pattern 520 constituting an integrated circuit. The cell pattern 520 may be formed to have a pitch in a predetermined range, for reliability. There may be a high possibility that, during a process of manufacturing the cell pattern 520, the pitch shifts or deviates from a target value, and as such it is desirable that a shift degree of the pitch be measured in an accurate manner for reliability.

In some embodiments, patterns formed at the first layer 300 may be used in measuring the pitch of patterns formed at the second layer 500. In some embodiments, the patterns formed at the second layer 500 may be used in measuring the pitch of the patterns formed at the first layer 300.

In some embodiments, the distance (for example, the height difference) between the first layer 300 and the second layer 500 may be 2 μm or less. For example, when the distance between the first layer 300 and the second layer 500 is 2 μm or less, variations in measurement values that are dependent on distance may be relatively unimportant (or even ignorable) when measuring the pitch of the patterns formed at the second layer 500. In addition, in some embodiments, when the distance between the first layer 300 and the second layer 500 is 2 μm or less, measurement of the pitch of patterns formed at the second layer 500 may be performed using a single focus.

The exemplary embodiments of the present disclosure are not limited to a particular distance between the first layer 300 and the second layer 500. For example, when the distance between the first layer 300 and the second layer 500 exceeds 2 μm in accordance with some embodiments, the pitch of the patterns formed at the second layer 500 may be measured using multiple focuses (for example, a double focus).

In some embodiments, the first layer 300 may include a first comparative pitch pattern 310 and a second comparative pitch pattern 320. The first comparative pitch pattern 310 and the second comparative pitch pattern 320 may be arranged adjacent to each other, although the present disclosure is not limited thereto.

The first comparative pitch pattern 310 may be a pattern array structure in which pattern structures having a predetermined line width are formed to have a first pitch. The second comparative pitch pattern 320 may be a pattern array structure in which pattern structures having a predetermined line width are formed to have a second pitch. In some embodiments, values of the first pitch and the second pitch may be different.

In some embodiments, the second layer 500 may include a key pattern 510, a middle pitch pattern 530, and a cell pattern 520.

The key pattern 510 may be a pattern array structure in which pattern structures having a predetermined line width are formed to have a third pitch. In some embodiments, the key pattern 510 may overlap with the first comparative pitch pattern 310 in a vertical direction (or a height direction). In some embodiments, at least a partial region of the key pattern 510 may be arranged so as to overlap with at least a partial region of the first comparative pitch pattern 310. The entire region of the key pattern 510 may overlap with at least a partial region of the first comparative pitch pattern 310. In some embodiments, the area (e.g., a layout area when viewed in a plan view) of the key pattern 510 may be smaller than the area of the first comparative pitch pattern 310.

The cell pattern 520 in the second layer 500 may include a pattern constituting an integrated circuit of the semiconductor device 10. The cell pattern 520 may be a pattern array structure in which pattern structures having a predetermined line width are formed to have a fourth pitch. In some embodiments, the cell pattern 520 may be arranged so as to be spaced apart from the key pattern 510 in the second layer 500. In some embodiments, the cell pattern 520 may overlap with the second comparative pitch pattern 320 in the vertical direction (or the height direction). In some embodiments, at least a partial region of the cell pattern 520 may overlap with a partial region of the second comparative pitch pattern 320. In some embodiments, the area of the cell pattern 520 may be smaller than the area of the second comparative pitch pattern 320.

The middle pitch pattern 530 may be a pattern array structure in which pattern structures having a predetermined line width are formed to have a fifth pitch. The middle pitch pattern 530 may be used to measure a pitch formed at the cell pattern 520 with reference to the key pattern 510. In some embodiments, the middle pitch pattern 530 may be between the key pattern 510 and the cell pattern 520 in the second layer 500. In some embodiments, a portion of the middle pitch pattern 530 may overlap with the first comparative pitch pattern 310 in the vertical direction (or the height direction). In some embodiments, the portion (a first region) of the middle pitch pattern 530 may overlap with a partial region of the first comparative pitch pattern 310. In some embodiments, another portion (a second region) of the middle pitch pattern 530 may overlap with the second comparative pitch pattern 320 in the vertical direction (or the height direction). In some embodiments, the other portion (second region) of the middle pitch pattern 530 may overlap with a partial region of the second comparative pitch pattern 320. In some embodiments, the area of the middle pitch pattern 530 may be equal to or greater than the area of the key pattern 510.

In some embodiments, the third pitch of key pattern 510 may have a minimum or maximum value from among the first to fifth pitches, and, corresponding thereto, the fourth pitch cell pattern 520 may have the other of the maximum or minimum value from among the first to fifth pitches. In this case, the fifth pitch of the middle pitch pattern 530 may have a value between the third pitch and the fourth pitch. In this case, the first pitch of the first comparative pitch pattern 310 may have a value between the third pitch and the fifth pitch. In this case, the second pitch of the second comparative pitch pattern 320 may have a value between the fourth pitch and the fifth pitch.

In some embodiments, at least one of the key pattern 510 and the middle pitch pattern 530 may be omitted from the second layer 500.

Hereinafter, a method for manufacturing the semiconductor device 10 that includes a procedure of measuring a pitch or a pitch shift of the cell pattern 520 formed at the second layer 500, will be described. In some embodiments, the pitch shift (or the pitch) of the cell pattern 520 may be measured through an exposure pattern for formation of the cell pattern 520 in a procedure of manufacturing the second layer 500.

Figure 2:
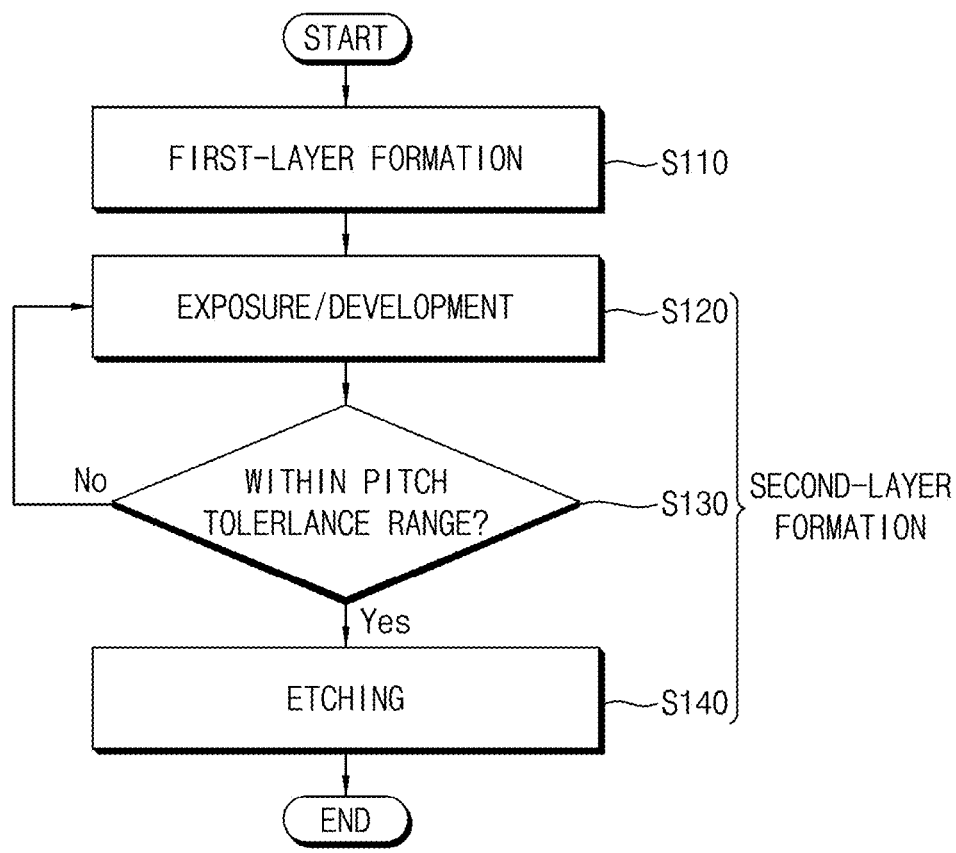
FIG. 2 is a flowchart explaining a method for manufacturing a semiconductor device in accordance with some exemplary embodiments of the disclosure.
Figure 3:
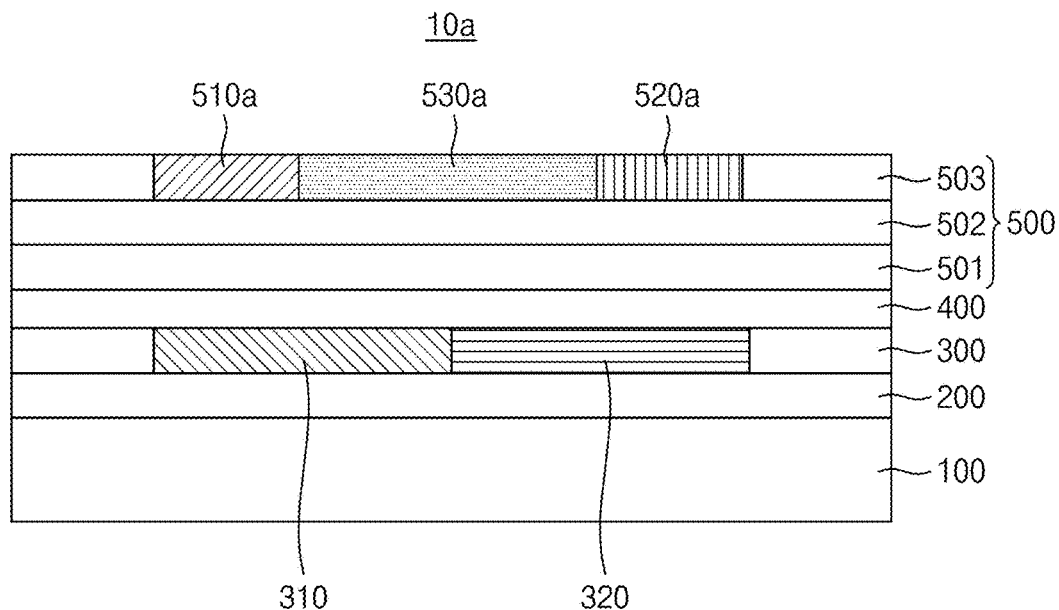
FIGS. 3 to 5 are views explaining a procedure of measuring a pitch shift of a cell pattern.
Figure 4:
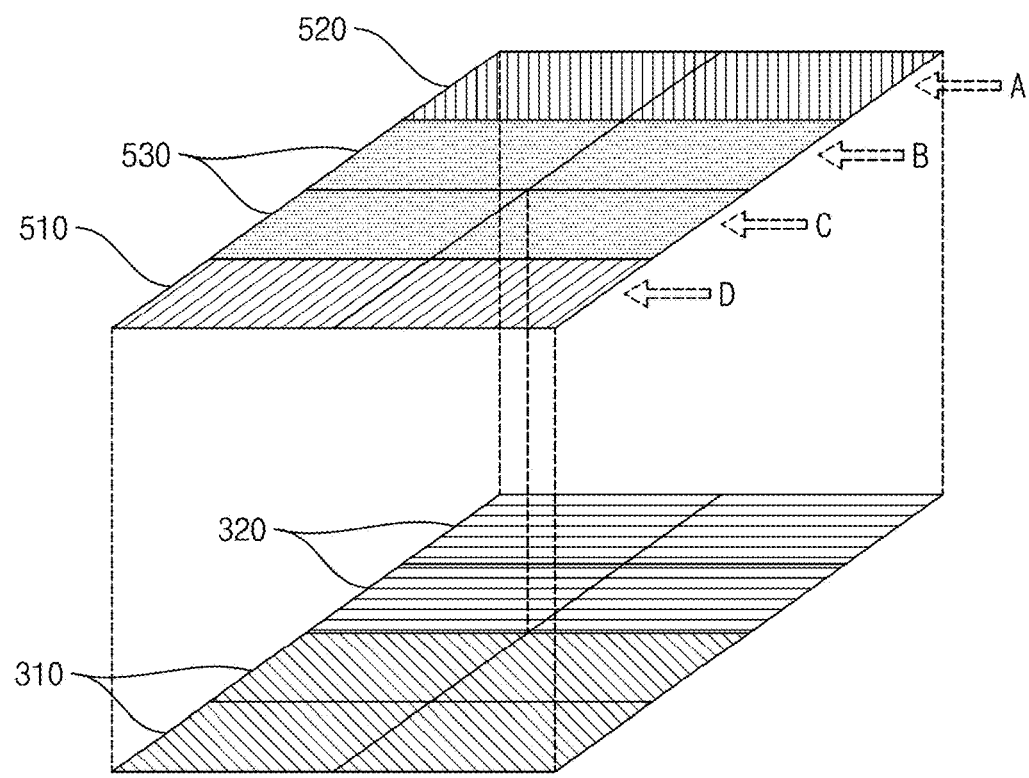
Figure 5:
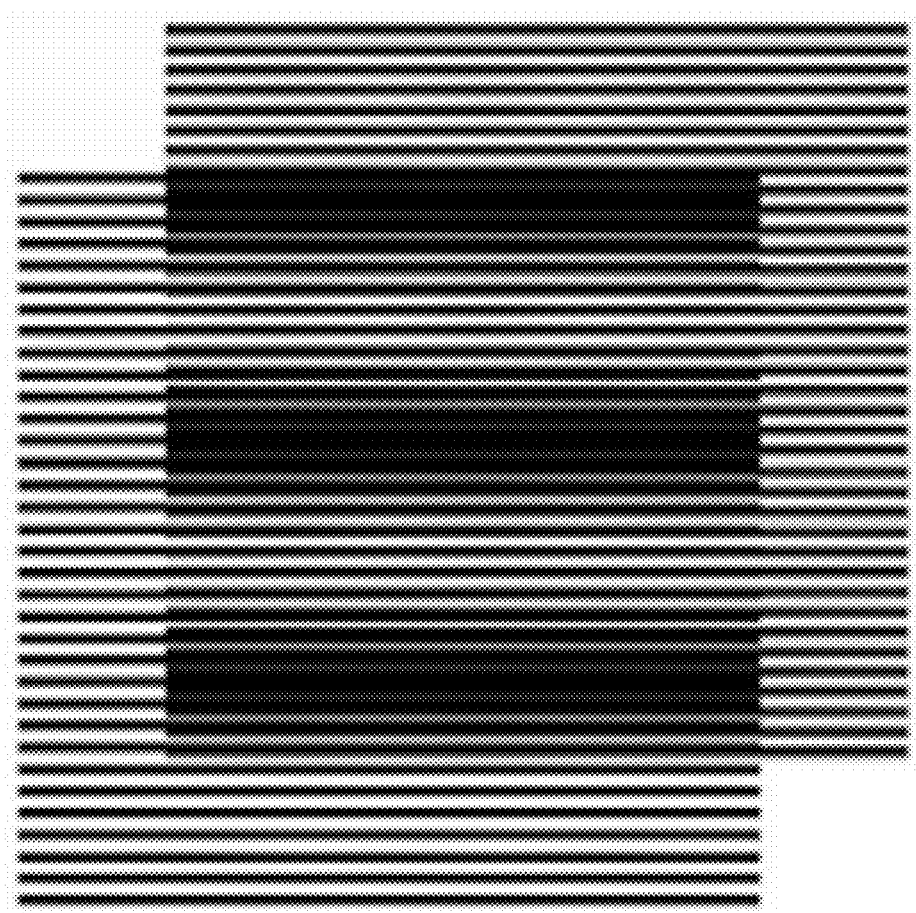

FIG. 2 is a flowchart explaining a method for manufacturing a semiconductor device in accordance with some exemplary embodiments of the disclosure. FIGS. 3 to 5 are views explaining a procedure of measuring a pitch shift of a cell pattern. Here, FIG. 3 shows a sectional view of a semiconductor device 10a in a part of procedures in a method for manufacturing the semiconductor device 10 shown in FIG. 1.

Referring to FIG. 2, the manufacturing method of the semiconductor device 10a may include a first-layer formation operation S110, an exposure/development operation S210, a pitch measurement operation S130, and an etching operation S140. Here, the exposure/development operation S120, the pitch measurement operation S130, and the etching operation S140 may be included in a procedure of forming the second layer 500.

For convenience of understanding, a procedure of manufacturing the semiconductor substrate 100 and a procedure of manufacturing the first insulating layer 200 and the second insulating layer 400 are omitted from the following manufacturing method of the semiconductor device 10a. Although not described clearly in the following description, for example, the manufacturing method of the semiconductor device 10a may include a procedure of sequentially forming (for example, stacking) a semiconductor device 100, a first insulating layer 200, a first layer 300, a second insulating layer 400 and a second layer 500.

Referring to FIGS. 1 to 4, the first-layer formation operation S110 corresponds to a procedure of forming the first layer 300 which includes a plurality of comparative pitch patterns (for example, the first comparative pitch pattern 310 and the second comparative pitch pattern 320 of FIG. 1).

In some embodiments, an exposure/development process and an etching process may be included in the procedure of forming the first layer 300. For example, the formation procedure of the first layer 300 may use a process (photolithography) of irradiating a resist film on a deposition material with light of a particular wavelength (exposure), thereby generating chemical structure variation of the resist film, selectively removing an exposed portion or an unexposed portion of the resist film using a solubility difference between the exposed portion and the unexposed portion (development), and removing a portion of the deposition material not overlapping with the remaining portion of the resist film (etching).

For example, the first layer 300 may be formed by first performing an exposure/development process at least one time, and then performing an etching process at least one time after the exposure process. In another example, the first layer 300 may be formed by repeatedly performing an exposure/development processes and etching processes. Here, the exposure/development process and the etching processes may use well-known methods used in manufacture of the semiconductor device 10a.

In some embodiments, the procedure of forming the second layer 500 may include the exposure/development operation S120 of at least one time, the pitch measurement operation S130 at least one time, and the etching operation S140. For example, the formation procedure of the second layer 500 may include a photolithography process, similarly to the formation procedure of the first layer 300.

As seen in FIG. 3, in some embodiments, the second layer 500 may be a structure in which a deposition material layer 501, a mask layer 502, and a resist film 503 are sequentially stacked in the formation procedure of the second layer 500. In some embodiments, the mask layer 502 may be omitted.

In some embodiments, the second layer 500 may be formed through the exposure/development operation S120 performed at least one time, the pitch measurement operation S130 performed at least one time, and the etching operation S140, The second layer 500 may include the key pattern 510, the middle pitch pattern 530 and the cell pattern 520 described with reference to FIG. 1.

In some embodiments, the exposure/development operation S120 corresponds to a procedure of performing an exposure process and a development process at positions of the second layer 500 where the key pattern 510, the cell pattern 520 and the middle pitch pattern 530 will be formed. Each of the key pattern 510, the cell pattern 520 and the middle pitch pattern 530 has a predetermined line width and a predetermined pitch. As the exposure/development operation S120 is performed, exposure patterns 510a, 520a and 530a respectively corresponding to the key pattern 510, the cell pattern 520 and the middle pitch pattern 530 may be formed at or in the resist film 503.

The first exposure pattern 510a corresponding to the key pattern 510 may be a pattern array structure in which pattern structures having a predetermine line width are formed to have a third pitch. The third pitch of the first exposure pattern 510a may have the same value as the third pitch of the key pattern 510. The first exposure pattern 510a may be a reference for measurement of a pitch formed at the second exposure pattern 520a corresponding to the cell pattern 520. In some embodiments, the first exposure pattern 510a may overlap with the first comparative pitch pattern 310 in the vertical direction (or the height direction). In some embodiments, the entire region of the first exposure pattern 510a may overlap with a partial region of the first comparative pitch pattern 310. In some embodiments, the area of the first exposure pattern 510a may be smaller than the area of the first comparative pitch pattern 310.

The second exposure pattern 520a corresponding to the cell pattern 520 may include a pattern constituting, in the second layer 500, an integrated circuit of the semiconductor device 10a. The second exposure pattern 520a may be a pattern array structure in which pattern structures having a predetermined line width are formed to have a fourth pitch. The fourth pitch of the second exposure pattern 520a may have the same value as the fourth pitch of the cell pattern 520. In some embodiments, the second exposure pattern 520a may be spaced apart from the first exposure pattern 510a in the second layer 500. In some embodiments, the second exposure pattern 520a may overlap with the second comparative pitch pattern 320 in the vertical direction (or the height direction). In some embodiments, at least a partial region of the second exposure pattern 520a may overlap with a partial region of the first comparative pitch pattern 310. In some embodiments, the area of the first exposure pattern 510a may be smaller than the area of the first comparative pitch pattern 310. In some embodiments, at least a partial region of the second exposure pattern 520a may be disposed to overlap with a partial region of the second comparative pitch pattern 320. In some embodiments, the area of the second exposure pattern 520a may be smaller than the area of the second comparative pitch pattern 320.

The third exposure pattern 530a corresponding to the middle pitch pattern 530 may be a pattern array structure in which pattern structures having a predetermined line width are formed to have a fifth pitch. The fifth pitch of the third exposure pattern 530a may have the same value as the fifth pitch of the middle pitch pattern 530. The third exposure pattern 530a may be used to measure a pitch formed at the second exposure pattern 520a with reference to the first exposure pattern 510a. In some embodiments, the third exposure pattern 530a may be between the first exposure pattern 510a and the second exposure pattern 520a. In some embodiments, a portion of the third exposure pattern 530a may overlap with the first comparative pitch pattern 310 in the vertical direction (or the height direction). In some embodiments, the portion (a first region) of the third exposure pattern 530a may overlap with a partial region of the first comparative pitch pattern 310. In some embodiments, another portion (a second region) of the third exposure pattern 530a may overlap with the second comparative pitch pattern 320 in the vertical direction (or the height direction). In some embodiments, the other portion (second region) of the third exposure pattern 530a may overlap with a partial region of the second comparative pitch pattern 320. In some embodiments, the area of the third exposure pattern 530a may be equal to or greater than the area of the first exposure pattern 510a.

In some embodiments, the exposure patterns 510a, 520a and 530a may be simultaneously formed in the exposure/development operation S120. In some embodiments, different exposure processes performed at positions where the exposure patterns 510a, 520a and 530a will be formed may be performed at different times.

The pitch measurement operation S130 may correspond to a procedure of measuring a shift degree of the pitch of the second exposure pattern 520a through a Moiré effect (see FIG. 5) generated due to overlap of the patterns formed at the first layer 300 (for example, the comparative pitch patterns 310 and 320) with the exposure patterns 510a, 520a and 530a formed at the second layer 500.

Since the pitch of the second exposure pattern 520a may be measured by measuring the shift degree of the pitch of the second exposure pattern 520a in the pitch measurement operation S130, the terms "the shift degree of the pitch of the pattern" and "the pitch of the pattern" are used as similar meanings without being distinguished from each other.

For example, when patterns respectively having two pitches (for example, P and Q) finely different from each other overlap each other (for example, the patterns being the first comparative pitch pattern 310 of the first layer 300 and the first exposure pattern 510a of the second layer 500), a Moiré effect (see FIG. 5) may be exhibited due to the two pitches, and a pitch x of a Moiré pattern may be calculated through application of the following Expression 1. In this case, the two pitches (for example, P and Q) finely different from each other should be within a pitch difference range in which the Moiré pattern will be formed.

$$x = \frac{PQ}{P - Q} \qquad \text{[Expression 1]}$$

For example, assuming that pitches (target values) of two patterns X and Y (for example, the first exposure pattern 510a and the second exposure pattern 520a) formed at a particular layer (for example, the second layer 500) are $P_X$ and $P_Y$, respectively, and shift degrees of the pitches $P_X$ and $P_Y$ of the two patterns X and Y are $d_X$ and $d_Y$, respectively, the following Expression 2 may be applied.

$$d_X = \frac{1}{x_X} P_X M_X + L_X \quad \text{[Expression 2]}$$

$$d_Y = \frac{1}{x_Y} P_Y M_Y + L_Y$$

In Expression 2, $M_X$ and $M_Y$ represent pitch shift degrees of the Moiré pattern (for example, shift degrees of the Moiré pattern from a predetermined pitch), and $L_X$ and $L_Y$ represent shift degrees of pitches of patterns (for example, the first comparative pitch pattern 310 and the second comparative pitch pattern 320) formed at a layer (for example, the first layer 300) different from the above-described layer while overlapping with the above-described two patterns X and Y.

For example, assuming that two patterns X and Y formed at a particular layer (for example, the second layer 500) are the first exposure pattern 510a and the third exposure pattern 530a, respectively, $L_X$ and $L_Y$ may be shift degrees of the pitch of the first comparative pitch pattern 310 overlapping with both the first exposure pattern 510a and the third exposure pattern 530a, respectively, and, as such, $L_X$ and $L_Y$ may have the same value.

In some embodiments, each pitch difference of the first exposure pattern 510a and the second exposure pattern 520a may be equal to or greater than a predetermined value, and as a result a Moiré pattern might not be generated in association with the same pattern formed at the first layer 300 (for example, in the case in which, although a Moiré pattern may be generated between the first exposure pattern 510a and one pattern of the first layer 300, no Moiré pattern may be generated between the second exposure pattern 520a and the pattern of the first layer 300 due to an excessive pitch difference). Accordingly, in some embodiments the third exposure pattern 530a may be introduced for calculation (e.g., relatively easy calculation) of the shift degree of the pitch of the second exposure pattern 520a from the first exposure pattern 510a.

For example, a pitch shift of a Moiré pattern between the first pattern X formed at the second layer 500 (for example, the first exposure pattern 510a) and the second pattern Y formed at the second layer 500 (for example, the third exposure pattern 530a) may be measured through one pattern of the first layer 300 (for example, the first comparative pitch pattern 310) overlapping with both the first pattern X and the second pattern Y. In addition, a pitch shift of a Moiré pattern between the second pattern Y formed at the second layer 500 (for example, the third exposure pattern 530a) and a third pattern Z formed at the second layer 500 (for example, the second exposure pattern 520a) may be measured through another pattern of the first layer 300 (for example, the second comparative pitch pattern 320) overlapping with both the second pattern Y and the third pattern Z. Thereafter, a pitch shift of a Moiré pattern between the patterns X and Z may be finally calculated using a measured value of the pitch shift of the Moiré pattern between the patterns X and Y and a measured value of the pitch shift of the Moiré pattern between the patterns Y and Z.

In the following description, reference symbols are defined as in the following Table 1, for convenience of description, and a method of calculating a pitch shift of the second exposure pattern 520a through application of Expressions 1 and 2 will be described. To be finally derived through this calculation method is a difference between the pitch shift of the second exposure pattern 520a and the pitch shift of the first exposure pattern 510a.

TABLE 1

| Moiré Pattern Measurement | Second Layer 500 | First Layer 300 | Predetermined Pitch of Moiré Pattern |
|---|---|---|---|
| First Measurement between A and θ2 | Second Exposure Pattern (A) | Second Comparative Pitch Pattern 320 (θ2) | a |
| Second Measurement between B and θ2 | Third Exposure Pattern (B) | Second Comparative Pitch Pattern 320 (θ2) | a |
| Third Measurement between C and θ2 | Third Exposure Pattern (C) | First Comparative Pitch Pattern 310 (θ1) | a |
| Fourth Measurement between D and θ1 | First Exposure Pattern (D) | First Comparative Pitch Pattern 310 (θ1) | a |

Reference is made to FIG. 4 for the positions of A to D in Table 1. In Table 1, the third exposure pattern 530a (B) refers to a region overlapping with the second comparative pitch pattern 320, and the third exposure pattern 530a (C) refers to a region overlapping with the first comparative pitch pattern 310. Shift degrees $d_A$, $d_B$, $d_C$ and $d_D$ of respective patterns A, B, C and D may be expressed by the following Expression 3, corresponding to Expression 2.

[Expression 3]

$$d_A = \frac{1}{x_A} P_A M_A + L_A \quad (1)$$

$$d_B = \frac{1}{x_B} P_B (-M_B) + L_B \quad (2)$$

$$d_C = \frac{1}{x_C} P_C M_C + L_C \quad (3)$$

$$d_D = \frac{1}{x_D} P_D (-M_D) + L_D \quad (4)$$

Thereafter, expressions (1) to (4) in Expression 3 may be sequentially calculated as expressed in the following Expression 4 and, as such, an expression (8) may be expressed by the following Expression 5.

[Expression 4]

$$(1)-(2) \quad (5)$$

$$(2)-(3) \quad (6)$$

$$(3)-(4) \quad (7)$$

$$(5)+(6)+(7) \quad (8)$$

$$d_A - d_D = \frac{1}{x}(P_A M_A + P_B M_B + P_C M_C + P_D M_D) \quad \text{[Expression 5]}$$

In Expression 4, $L_A=L_B$ (for θ2) and $L_C=L_D$ (for θ2) because $L_A$ and $L_B$ are associated with the same comparative pitch pattern, and $L_C$ and $L_D$ are associated with the same comparative pitch pattern. In addition, in Expression 4, $d_B=d_C$ because $d_B$ and $d_C$ are associated with the same middle pitch pattern 530. In addition, predetermined pitches $x_A$, $x_B$, $x_C$ and $x_D$ of Moiré patterns have a value of a and, as such, are equal ($a=x_A=x_B=x_C=x_D$). Accordingly, the expression (8) in Expression 4 may be expressed by Expression 5. As such, a difference $d_A-d_D$ between the pitch shift of the second exposure pattern 520a and the pitch shift of the first exposure pattern 510a may be derived on the basis of measured Moiré patterns, through Expressions 3 to 5. The pitch shift of the first exposure pattern 510a may be measured (calculated) in accordance with a relation thereof with the first comparative pitch pattern 310 and, as such, the pitch shift of the second exposure pattern 520a may be estimated.

In some embodiments, in the pitch measurement operation S130, whether or not the difference between the pitch shift of the second exposure pattern 520a and the pitch shift of the first exposure pattern 510a is within a (predetermined) tolerance range may be determined. In other words, in the pitch measurement operation S130, whether or not the pitch shift (or the pitch) of the second exposure pattern 520a is within a tolerance range may be determined.

In some embodiments, upon determining, in the pitch measurement operation S130, that the pitch shift of the second exposure pattern 520a is within the tolerance range, the etching operation S140 may be performed. When determined, in the pitch measurement operation S130, the pitch shift of the second exposure pattern 520a exceeds the tolerance range, the exposure/development operation S120 and the pitch measurement operation S130 may be again performed.

The etching operation S140 corresponds to a procedure of performing an etching process for the second layer 500, which has been completely subjected to exposure and development. As the second layer 500 has been subjected to the etching operation S140, the cell pattern 520, which has a pitch within a tolerance range, may be formed at the deposition material layer 501 of the second layer 500. In this case, the mask layer 502 and the resist film 503 may be removed.

In some embodiments, a pitch shift of an exposure pattern (for example, the second exposure pattern 520a) corresponding to the cell pattern 520 was measured through introduction of an exposure pattern (for example, the third exposure pattern 530a) corresponding to one middle pitch pattern 530. In some embodiments, it may be possible to measure a pitch shift of the second exposure pattern 520a through introduction of exposure patterns corresponding to a plurality of middle pitch patterns 530 between the second exposure pattern 520a and the first exposure pattern 510a.

Figure 6:
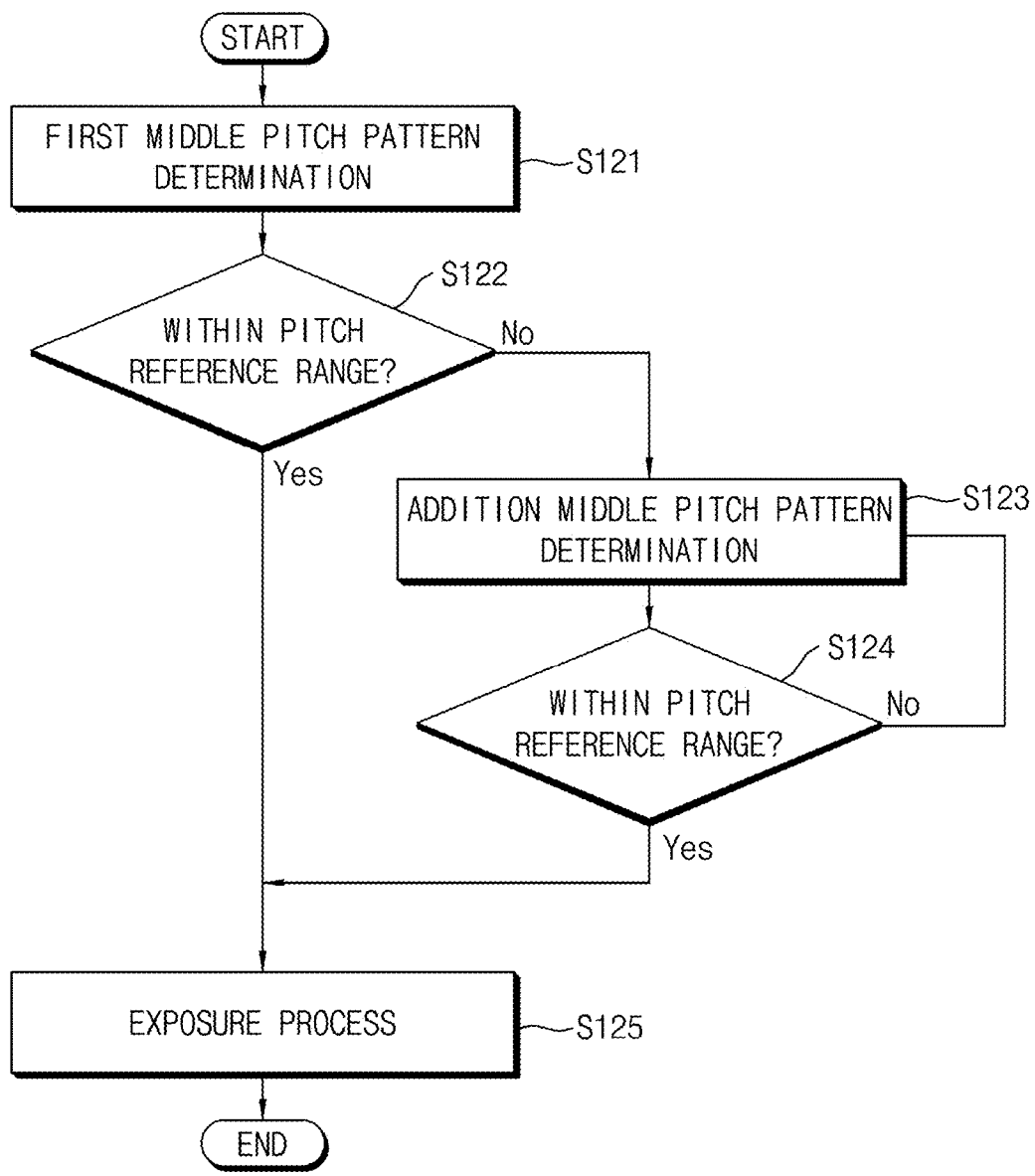
FIG. 6 is a flowchart explaining an exposure procedure in the semiconductor device manufacturing method according to some exemplary embodiments of the disclosure.
Figure 7:
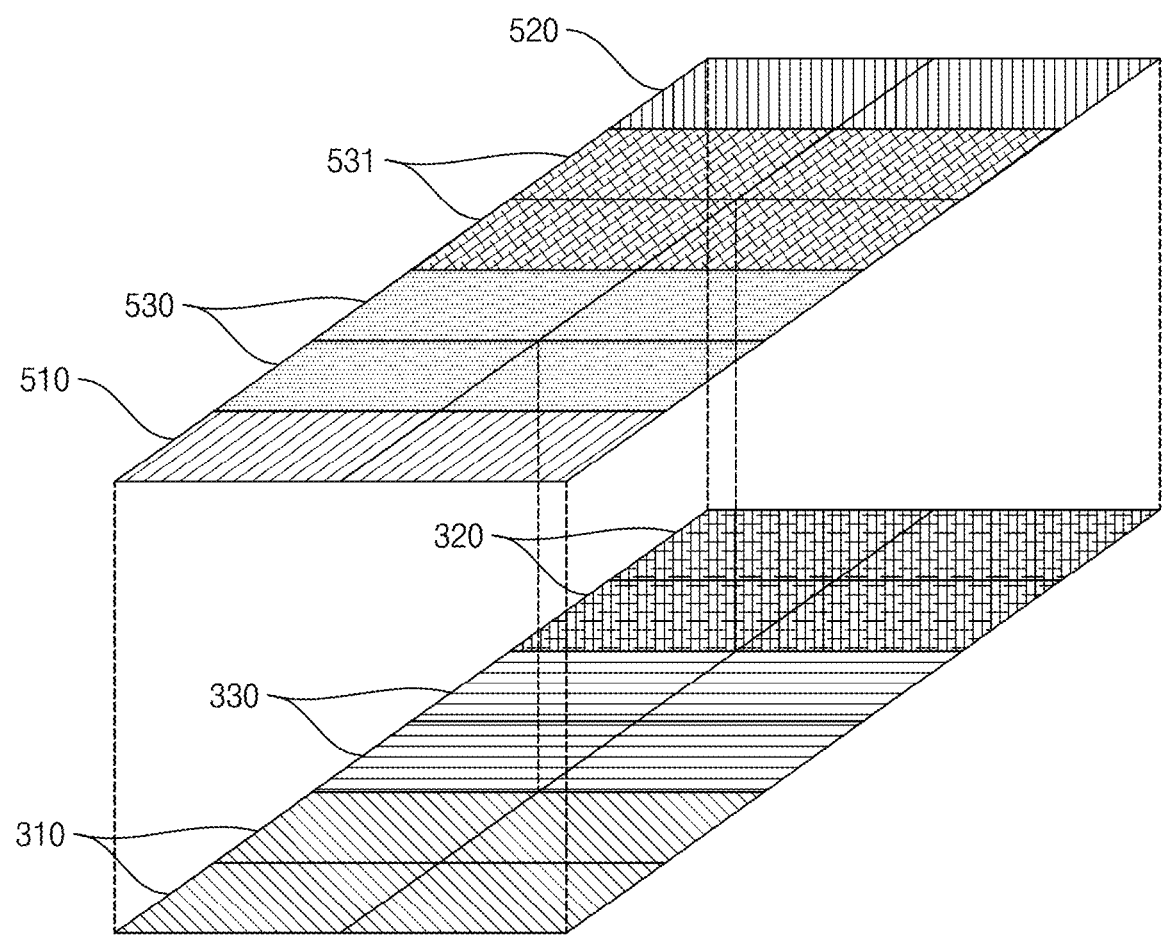
FIGS. 7 and 8 are views explaining procedures of FIG. 6, respectively.
Figure 8:
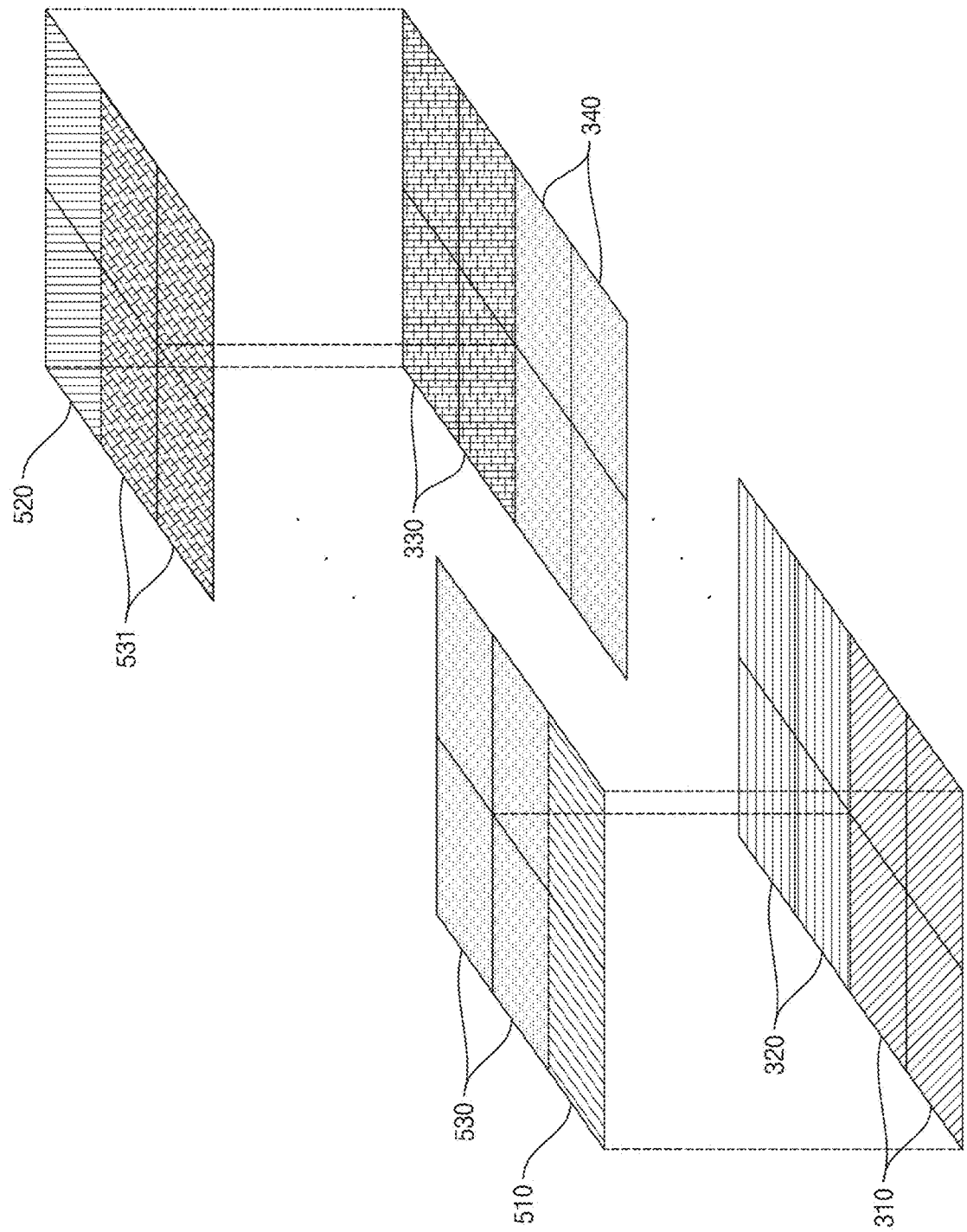

FIG. 6 is a flowchart explaining an exposure procedure in the semiconductor device manufacturing method according to some exemplary embodiments of the disclosure. FIGS. 7 and 8 are views explaining procedures of FIG. 6, respectively.

Referring to FIG. 6, in some embodiments, the exposure/development operation S120 may include middle pitch pattern determination operations S121 and S123 of at least one time, and pitch range checking operations S122 and S124 of at least one time.

The middle pitch pattern determination operation S121 corresponds to a procedure of determining a position and a pitch of the first middle pitch pattern 530. In some embodiments, the pitch of the first middle pitch pattern 530 may be determined to be a value between the pitch of the cell pattern 520 and the pitch of the key pattern 510. In some embodiments, the position of the first middle pitch pattern 530 may be determined to be between the position of the cell pattern 520 and the position of the key pattern 510.

After the first middle pitch pattern determination operation S121, the pitch range checking operation S122 may be performed. The pitch range checking operations S122 and S124 correspond to a procedure of checking whether or not each of pitch differences between the first middle pitch pattern 530 and patterns adjacent thereto at opposite sides thereof corresponds to a range in which a Moiré pattern will be formed. For example, whether or not the pitch difference between the first middle pitch pattern 530 and the cell pattern 520 corresponds to the Moiré pattern formation range and whether or not the pitch difference between the first middle pitch pattern 530 and the key pattern 510 corresponds to the Moiré pattern formation range may be checked.

When both the pitch differences between the first middle pitch pattern 530 and the patterns adjacent thereto at opposite sides thereof correspond to the Moiré pattern formation range, an exposure process operation S125 may be performed.

On the other hand, when at least one of the pitch differences between the first middle pitch pattern 530 and the patterns adjacent thereto at opposite sides thereof is beyond the Moiré pattern formation range, additional middle pitch pattern determination operation S123 may be performed.

Referring to FIGS. 6 and 7, in the additional middle pitch pattern determination operation S123, a position and a pitch of an additional middle pitch pattern 530 to be introduced between patterns having a pitch difference beyond the Moiré pattern formation range from among the first middle pitch pattern 530 and the patterns adjacent thereto at opposite sides thereof may be determined. The position of the additional middle pitch pattern 530 may be determined to be between the first middle pitch pattern 530 and the adjacent pattern, which has a pattern difference beyond the Moiré pattern formation range with respect to the first middle pitch pattern 530. The pitch of the additional middle pitch pattern 530 may be determined to be between the pitch of the first middle pitch pattern 530 and the pitch of the adjacent pattern, which has a pattern difference beyond the Moiré pattern formation range with respect to the first middle pitch pattern 530.

Referring to FIGS. 6 and 8, in some embodiments, after the additional middle pitch pattern determination S123, the pitch range checking operations S122 and S124 and the additional middle pitch pattern determination operation S123 may be repeated. When the pitch range checking operations S122 and S124 and the additional middle pitch pattern determination operation S123 are repeated a plurality of times, exposure patterns of a plurality of middle pitch patterns 530 and 531 may be formed between the second exposure pattern 520a and the first exposure pattern 510a in the second layer. In this case, in some embodiments, the first layer may include a plurality of comparative pitch patterns 310, 320, 330 and 340.

Figure 9:
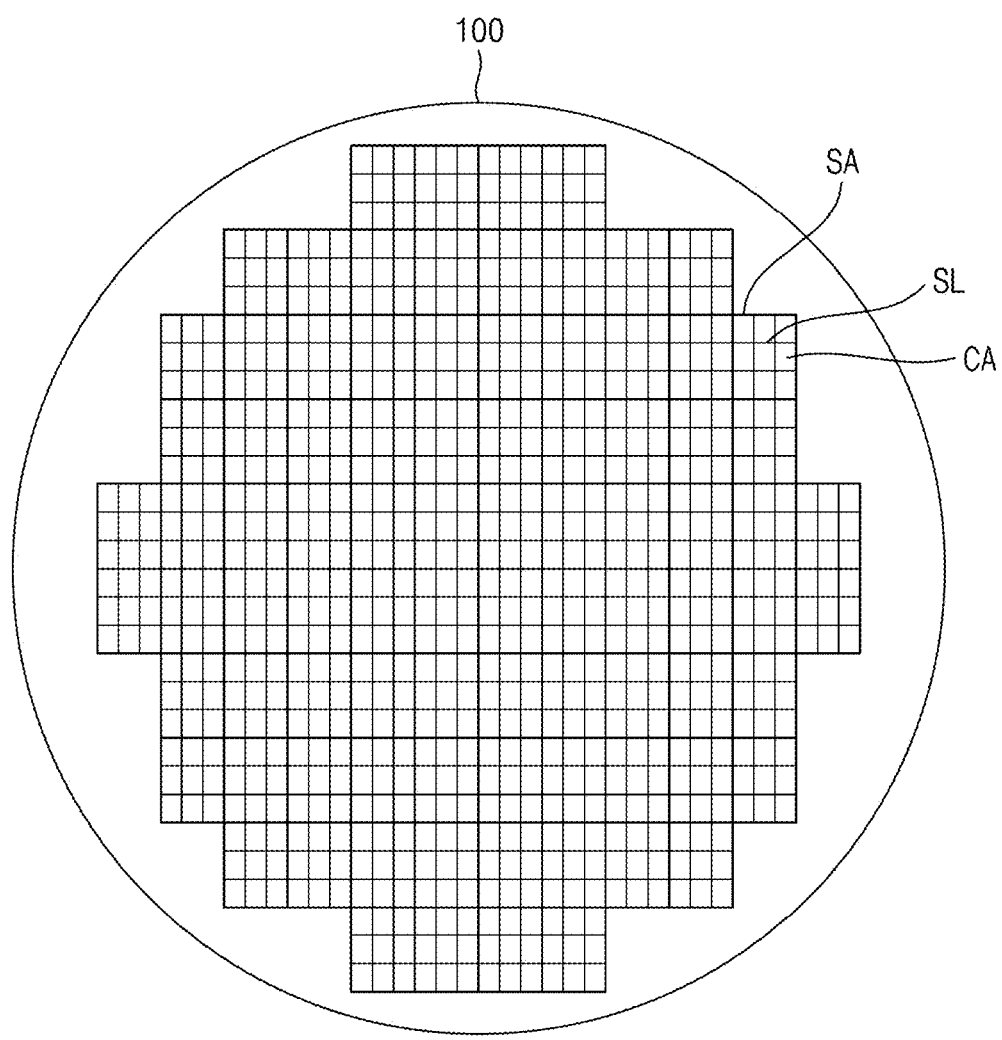
FIG. 9 is a plan view schematically showing a semiconductor substrate according to some exemplary embodiments of the disclosure.
Figure 10:
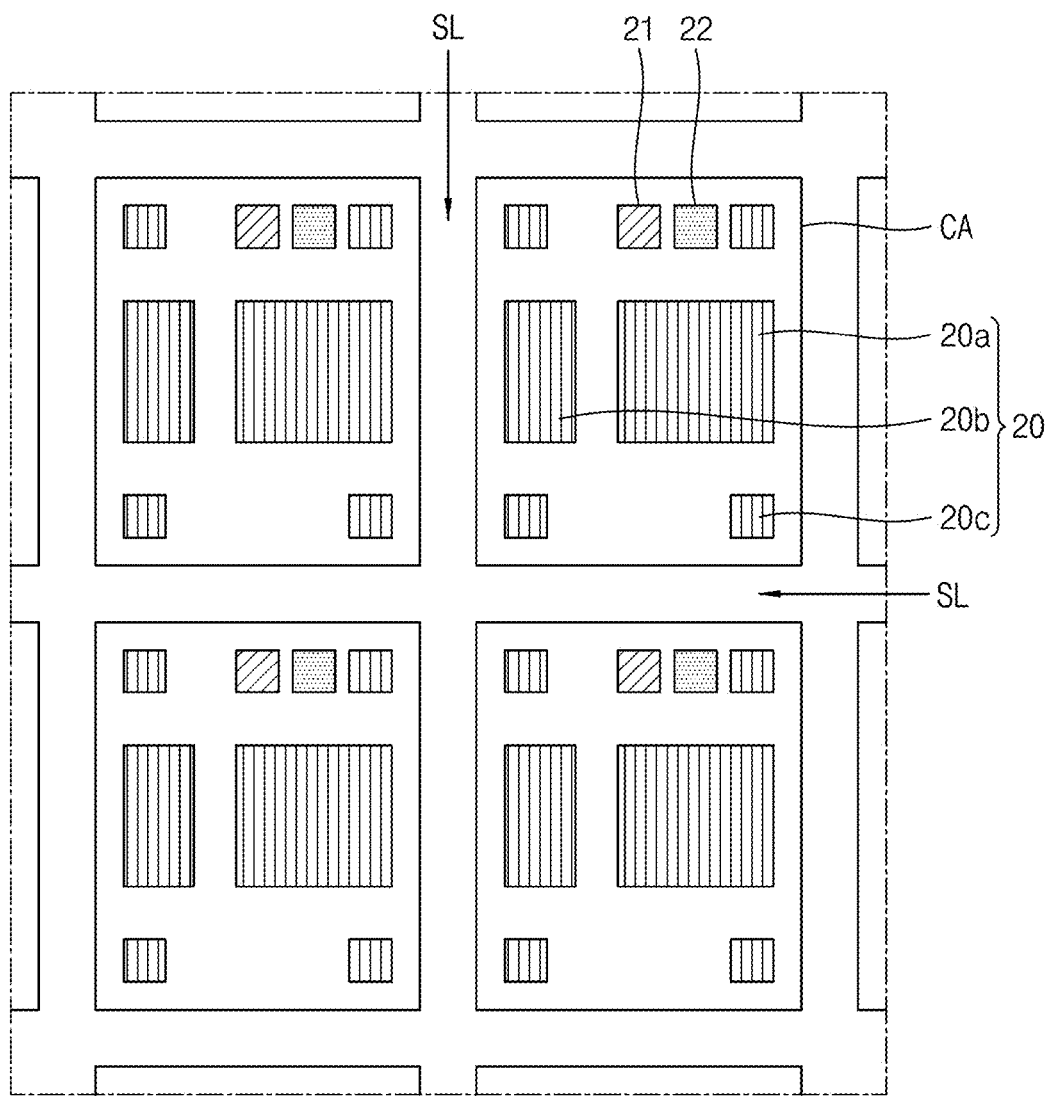
FIGS. 10 to 12 are enlarged views of a semiconductor die of FIG. 9 in accordance with some exemplary embodiments of the disclosure.
Figure 11:
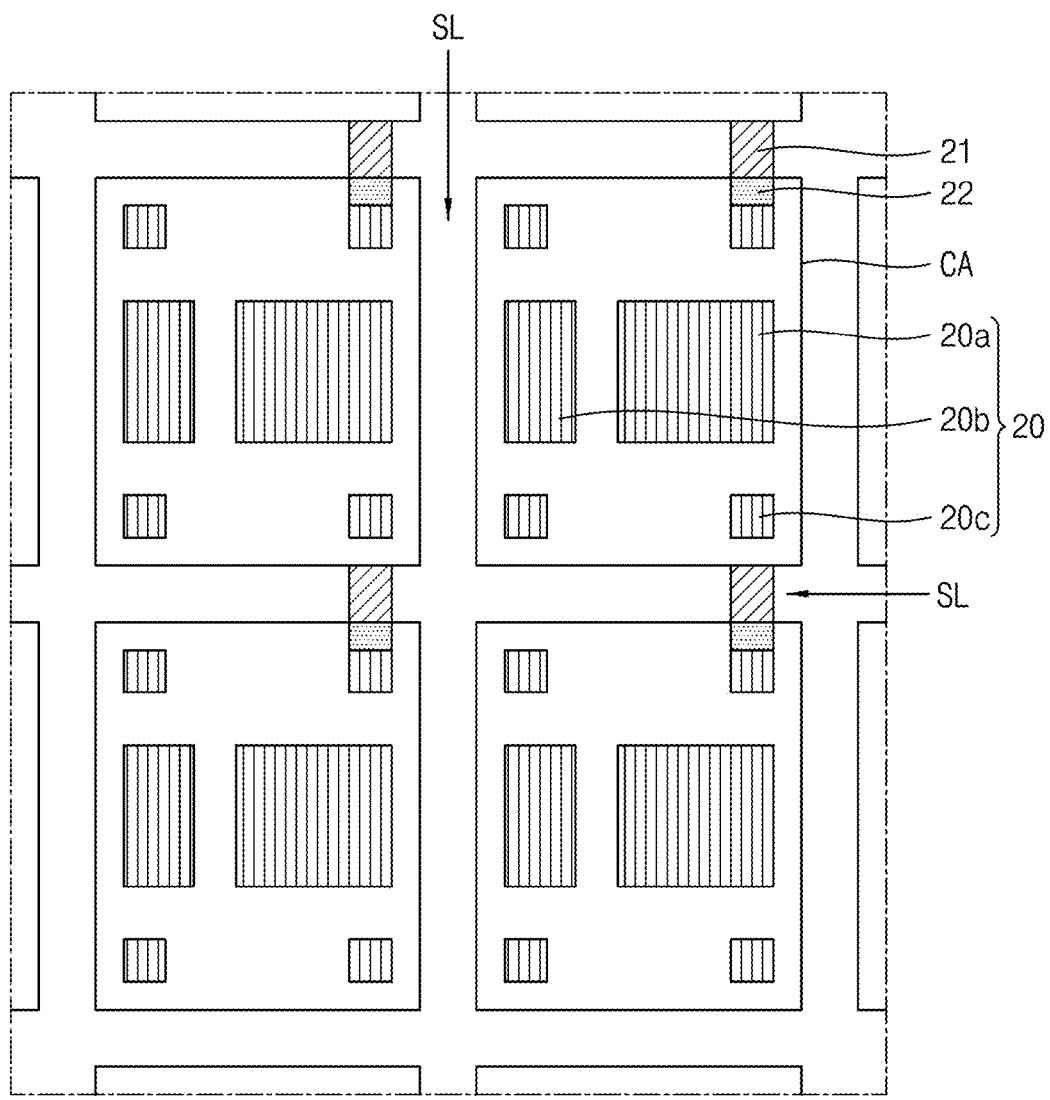
Figure 12:
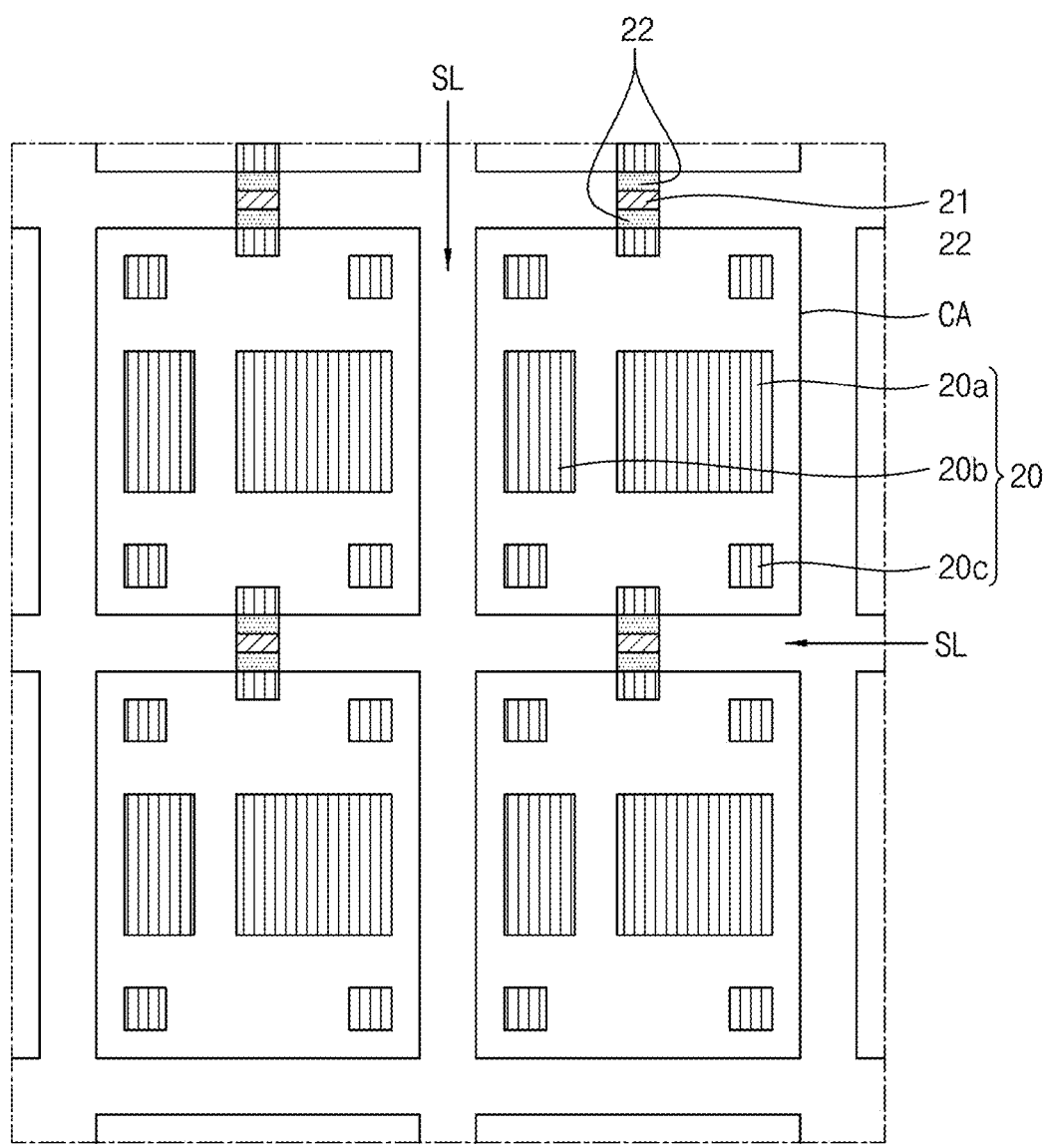

FIG. 9 is a plan view schematically showing a semiconductor substrate according to some exemplary embodiments of the disclosure. FIGS. 10 to 12 are enlarged views of a semiconductor die of FIG. 9 in accordance with some embodiments.

Referring to FIGS. 9 to 12, a semiconductor substrate 100 may include a plurality of shot areas SA. Each of the shot areas SA may be an area of the semiconductor substrate 100 that is exposed by an exposure process at one time. For example, each shot area SA may include one chip area CA, or may include a plurality of chip areas CA. A scribe lane area SL may be arranged among or between the chip areas CA. The chip areas CA may be defined by the scribe lane area SL.

Each of the chip areas CA may include a plurality of circuit regions 20. The circuit regions 20 may include a logic circuit region 20*a*, a memory region 20*b* and an input/output device region 20*c*, as examples. Here, the chip area CA may also be referred to as an "in-cell area." In some embodiments, the logic circuit region 20*a*, the memory region 20*b* and the input/output device region 20*c* may have the same pitch. In some embodiments, at least one of the logic circuit region 20*a*, the memory region 20*b* and the input/output device region 20*c* may include the function of the above-described cell pattern 520 (see FIG. 1). In FIGS. 10 to 12, a key pattern 21 may correspond to the key pattern 510 of FIG. 1, and a middle pitch pattern 22 may correspond to the middle pitch pattern 530 of FIG. 1.

In some embodiments, as shown in FIG. 10, the middle pitch pattern 22 and the key pattern 21 may be formed in the chip area CA, as well as the at least one of the logic circuit region 20*a*, the memory region 20*b* and the input/output device region 20*c* that includes the function of the above-described cell pattern 520.

In some embodiments, as shown in FIGS. 11 and 12, at least one of the middle pitch pattern 22 and the key pattern 21 may be formed in the scribe lane area SL.

Figure 13:
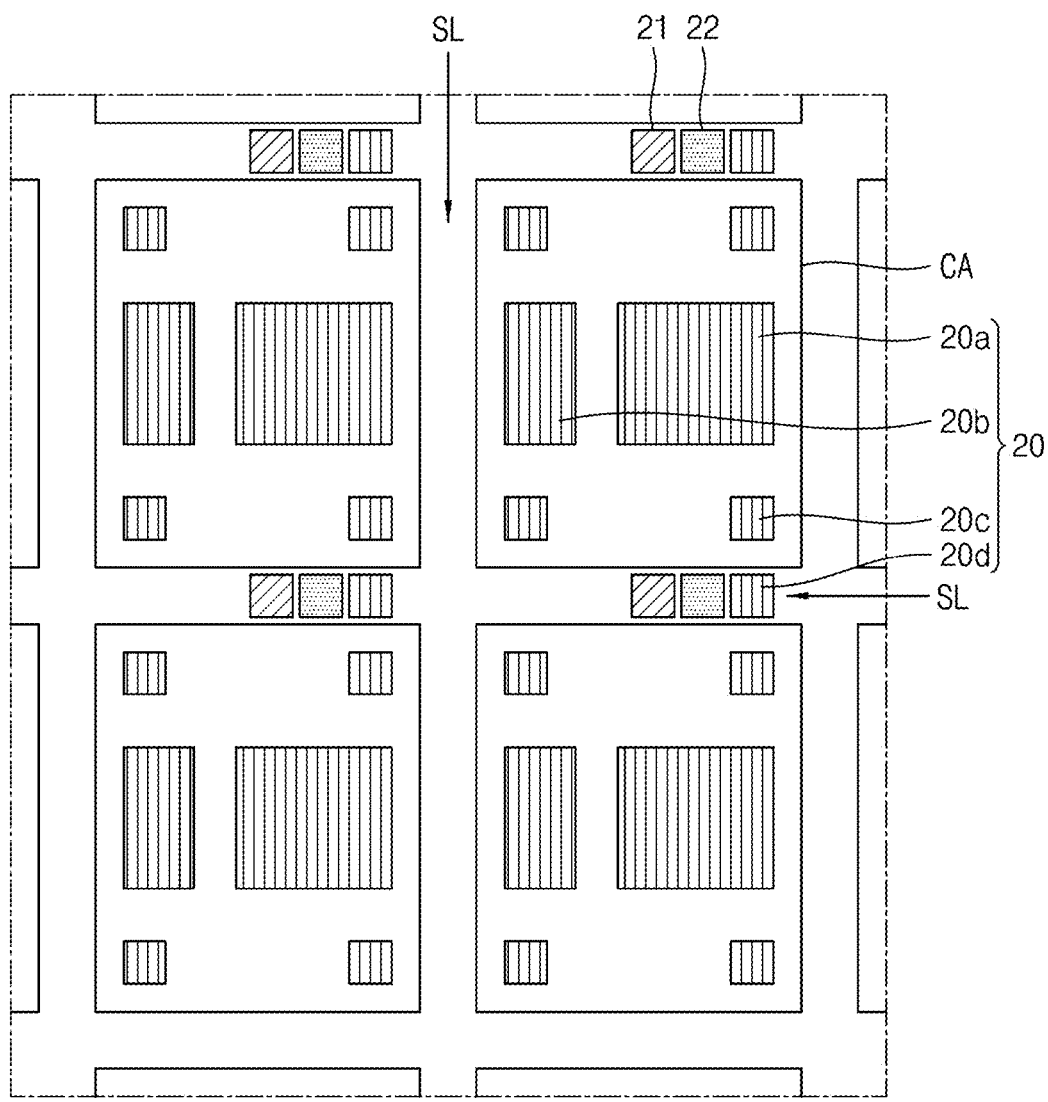
FIG. 13 is an enlarged view of the semiconductor die of FIG. 9 according to some exemplary embodiments of the disclosure.

FIG. 13 is an enlarged view of the semiconductor die of FIG. 9 according to some embodiments.

Referring to FIG. 13, a part of the plurality of circuit regions 20 may be in the scribe lane area SL, as compared to the embodiments of FIGS. 10 to 12. The plurality of circuit regions 20 may further include a separate cell pattern 20*d* having the same pitch as the logic circuit region 20*a*, the memory region 20*b* and the input/output device region 20*c*, as compared to the embodiments of FIGS. 10 to 12.

In some embodiments, the cell pattern 20*d* may be within the scribe lane area SL. For example, all of the cell pattern 20*d*, the middle pitch pattern 22 and the key pattern 12 may be formed in the scribe lane area SL.

Although not shown in the figures, in some embodiments, the separate cell pattern 20*d* may be omitted, and at least one of the logic circuit region 20*a*, the memory region 20*b* and the input/output device region 20*c* may be within the scribe lane area SL and may perform a function of the cell pattern 20*d*.

In accordance with some exemplary embodiments of the disclosure, in measurement of a pitch shift of a cell pattern, large volumes of measurement data may be rapidly processed.

In addition, it may be possible to measure the pitch shift of the cell pattern without using a scanning electron microscope.

Furthermore, the pitch shift of the cell pattern may be measured in a photolithography process, before an etching process, and, as such, even if and/or when formation of a layer is determined to have failed, an exposure process may be again performed without completely removing the layer (for example, without performing an etching process).

While some embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:

1. A method for manufacturing a semiconductor device, comprising:
    forming a first layer comprising a plurality of patterns, each of the plurality of patterns having a different respective pitch;
    performing exposure and development to form an exposure pattern in a second layer at a layer different from the first layer;
    determining whether or not a pitch shift of a part of exposure patterns formed by the performing the exposure and the development is within a tolerance range, using a Moiré pattern; and
    performing etching for the second layer when the pitch shift of the part of exposure patterns is determined to be within the tolerance range,
    wherein the performing the exposure and the development to form the second layer comprises:
        forming a first exposure pattern corresponding to a key pattern having a first pitch,
        forming a second exposure pattern corresponding to a cell pattern having a second pitch, and
        forming a third exposure pattern corresponding to a middle pitch pattern having a third pitch between the first pitch and the second pitch.

2. The method according to claim 1, further comprising: performing the exposure a second time when the pitch shift is determined to be outside the tolerance range.

3. The method according to claim 1, wherein the first layer comprises:
    a first comparative pitch pattern overlapping with both the first exposure pattern and the third exposure pattern; and
    a second comparative pitch pattern overlapping with both the second exposure pattern and the third exposure pattern.

4. The method according to claim 3, wherein:
    the first comparative pitch pattern has a fourth pitch between the first pitch and the third pitch; and
    the second comparative pitch pattern has a fifth pitch between the third pitch and the second pitch.

5. The method according to claim 4, wherein the first exposure pattern and the first comparative pitch pattern form a first Moiré pattern, the third exposure pattern and the first comparative pitch pattern form a second Moiré pattern, the third exposure pattern and the second comparative pitch pattern form a third Moiré pattern, and the second exposure pattern and the second comparative pitch pattern form a fourth Moiré pattern.

6. The method according to claim 5, wherein a pitch shift of the second exposure pattern is calculated using a pitch shift of each of the first to fourth Moiré patterns.

7. The method according to claim 3, wherein determining whether or not the pitch shift of the second exposure pattern is within a predetermined range is based on a calculated first difference between a pitch shift of the second exposure pattern and a pitch shift of a first region of the third exposure pattern, a calculated second difference between the pitch shift of the first region of the third exposure pattern and a pitch shift of a second region of the third exposure pattern, a calculated third difference between the pitch shift of the second region of the third exposure pattern and a pitch shift of the first exposure pattern, and a calculated fourth difference between the pitch shift of the second exposure pattern and the pitch shift of the first exposure pattern.

8. The method according to claim 7, wherein:
the first region of the third exposure pattern overlaps with the second comparative pitch pattern; and
the second region of the third exposure pattern overlaps with the first comparative pitch pattern.

9. The method according to claim 8, wherein the cell pattern, the key pattern, and the middle pitch pattern are formed at the second layer by the etching.

10. The method according to claim 1, wherein:
an insulating layer is between the first layer and the second layer; and
a height difference between the first layer and the second layer is 2 μm or less.

11. The method according to claim 1, wherein:
the first layer is on a semiconductor substrate; and
the second layer is on the first layer.

12. The method according to claim 1, wherein the third exposure pattern is between the first exposure pattern and the second exposure pattern.

13. The method according to claim 1, wherein the performing the exposure and the development further comprises:
determining a position and a pitch of the middle pitch pattern;
determining whether or not both a first pitch difference between the pitch of the middle pitch pattern and a pitch of the key pattern and a second pitch difference between the pitch of the middle pitch pattern and a pitch of the cell pattern are within a range in which a Moiré pattern will be formed; and
determining a position and a pitch of an additional middle pitch pattern when at least one of the first pitch difference between the middle pitch pattern and the key pattern and the second pitch difference between the middle pitch pattern and the cell pattern is outside the Moiré pattern formation range.

14. The method according to claim 13, wherein:
when the first pitch difference between the middle pitch pattern and the key pattern is outside the Moiré pattern formation range, the position of the additional middle pitch pattern is determined to be between the middle pitch pattern and the key pattern, and the pitch of the additional middle pitch pattern is determined to have a value between the pitch of the middle pitch pattern and the pitch of the key pattern; and
when the second pitch difference between the middle pitch pattern and the cell pattern is outside the Moiré pattern formation range, the position of the additional middle pitch pattern is determined to be between the middle pitch pattern and the cell pattern, and the pitch of the additional middle pitch pattern is determined to have a value between the pitch of the middle pitch pattern and the pitch of the cell pattern.

15. A method for manufacturing a semiconductor device, comprising:
forming a first layer comprising a first comparative pitch pattern and a second comparative pitch pattern respectively having different pitches;
performing exposure and development to form a first exposure pattern having a first pitch, a second exposure pattern having a second pitch and a third exposure pattern having a third pitch between the first pitch and the second pitch at a second layer different from the first layer;
determining whether or not a pitch shift of the second exposure pattern is within a predetermined range, based on arithmetically calculating a first difference between a pitch shift of the second exposure pattern and a pitch shift of a first region of the third exposure pattern, a second difference between the pitch shift of the first region of the third exposure pattern and a pitch shift of a second region of the third exposure pattern, a third difference between the pitch shift of the second region of the third exposure pattern and a pitch shift of the first exposure pattern, and a fourth difference between the pitch shift of the second exposure pattern and the pitch shift of the first exposure pattern; and
performing etching for the second layer when the pitch shift of the second exposure pattern is within the predetermined range, such that a cell pattern having a pitch within a tolerance range is formed at the second layer.

16. The method according to claim 15, further comprising performing the exposure and the development again when the pitch shift is measured to be outside the tolerance range.

17. The method according to claim 15, wherein:
the first comparative pitch pattern has a fourth pitch between the first pitch and the third pitch; and
the second comparative pitch pattern has a fifth pitch between the third pitch and the second pitch.

18. The method according to claim 15, wherein the third exposure pattern overlaps with both the first comparative pitch pattern and the second comparative pitch pattern.

19. The method according to claim 18, wherein:
the first comparative pitch pattern overlaps with the first exposure pattern and the first region of the third exposure pattern; and
the second comparative pitch pattern overlaps with the second exposure pattern and the second region of the third exposure pattern different from the first region.

20. A method for manufacturing a semiconductor device, comprising:
forming a first layer comprising a plurality of patterns respectively having different pitches;
performing exposure and development for a resist film to form an exposure pattern in a second layer at a layer different from the first layer;
determining, using a Moiré pattern, whether or not a pitch shift of a part of exposure patterns formed at the resist film by the performing the exposure and the development is within a tolerance range; and
performing etching for the second layer when the pitch shift of the part of exposure patterns is determined to be within the tolerance range,
wherein the performing the exposure comprises:
forming a first exposure pattern having a first pitch,
forming a second exposure pattern having a second pitch, and forming exposure patterns corresponding to a plurality of middle pitch patterns having a pitch between the first pitch and the second pitch, wherein the first layer is on a semiconductor substrate;

wherein the second layer is on the first layer, wherein the exposure patterns corresponding to the plurality of middle pitch patterns are between the first exposure pattern and the second exposure pattern at the second layer.

* * * * *